US012101906B2

(12) United States Patent
Lyon

(10) Patent No.: US 12,101,906 B2
(45) Date of Patent: Sep. 24, 2024

(54) FLUID HEAT EXCHANGER

(71) Applicant: COOLIT SYSTEMS INC., Calgary (CA)

(72) Inventor: Geoff Sean Lyon, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 29 days.

(21) Appl. No.: 15/462,753

(22) Filed: Mar. 17, 2017

(65) Prior Publication Data

US 2017/0196116 A1    Jul. 6, 2017

Related U.S. Application Data

(63) Continuation of application No. 14/283,163, filed on May 20, 2014, now Pat. No. 9,603,284, which is a
(Continued)

(51) Int. Cl.
*H05K 7/20* (2006.01)
*F28D 15/00* (2006.01)
(Continued)

(52) U.S. Cl.
CPC ............. *H05K 7/20* (2013.01); *F28D 15/00* (2013.01); *F28F 3/00* (2013.01); *H01L 23/473* (2013.01);
(Continued)

(58) Field of Classification Search
CPC .......... H05K 7/20218; H05K 7/20254; H05K 7/20263; H05K 7/20272; H01L 23/4735; H01L 23/473
(Continued)

(56) References Cited

U.S. PATENT DOCUMENTS

| 3,073,385 A | 1/1963 | Peters |
| 4,345,643 A * | 8/1982 | Dawson ................... F28F 3/12 165/122 |

(Continued)

FOREIGN PATENT DOCUMENTS

| EP | 1808892 | 7/2007 |
| JP | 61032449 | 2/1986 |

(Continued)

OTHER PUBLICATIONS

USPTO Patent Trial and Appeal Board Final Written Decision in Case IPR2015-01276 dated Dec. 8, 2016.
(Continued)

*Primary Examiner* — Frantz F Jules
*Assistant Examiner* — Jason N Thompson
(74) *Attorney, Agent, or Firm* — WORKMAN NYDEGGER

(57) ABSTRACT

A fluid heat exchanger for cooling an electronic device can have a plurality of walls. The walls can define a corresponding plurality of microchannels. Each microchannel can extend from a first end to a second end. The plurality of microchannels can define at least two opposed outer microchannels and a centrally located microchannel positioned between the opposed outer microchannels. A fluid inlet passage can be configured to deliver a heat-exchange fluid to each microchannel between the corresponding first end and the corresponding second end of the respective microchannel. A fluid outlet passage can have an enlarged outlet region from the centrally located microchannel compared to a corresponding outlet region from one or both of the opposed outer microchannels. Related methods are disclosed.

15 Claims, 2 Drawing Sheets

Related U.S. Application Data continuation of application No. 12/189,476, filed on Aug. 11, 2008, now Pat. No. 8,746,330.

(60) Provisional application No. 60/954,987, filed on Aug. 9, 2007.

(51) Int. Cl.
*F28F 3/00* (2006.01)
*H01L 23/473* (2006.01)

(52) U.S. Cl.
CPC ...... *H05K 7/20254* (2013.01); *F28F 2260/02* (2013.01); *H01L 2924/0002* (2013.01)

(58) Field of Classification Search
USPC .................. 165/80.4, 170; 361/699; 257/714
See application file for complete search history.

(56) References Cited

U.S. PATENT DOCUMENTS

| | | | |
|---|---|---|---|
| 4,450,472 A | 5/1984 | Tuckerman et al. | |
| 4,561,040 A | 12/1985 | Eastman et al. | |
| 4,564,040 A | 1/1986 | Rudelick | |
| 4,750,086 A | 6/1988 | Mittal | |
| 4,758,926 A | 7/1988 | Herrell et al. | |
| 4,768,581 A | 9/1988 | Gotwald et al. | |
| 4,898,153 A | 2/1990 | Sherwood | |
| 4,909,315 A * | 3/1990 | Nelson ................ | H01L 23/4336 165/185 |
| 4,940,085 A | 7/1990 | Nelson et al. | |
| 5,016,090 A | 5/1991 | Galyon | |
| 5,070,936 A | 12/1991 | Carroll | |
| 5,099,311 A | 3/1992 | Bonde et al. | |
| 5,203,401 A | 4/1993 | Hamburgen et al. | |
| 5,218,515 A | 6/1993 | Bernhardt | |
| 5,265,670 A | 11/1993 | Zingher | |
| 5,294,830 A | 3/1994 | Young et al. | |
| 5,309,319 A | 5/1994 | Messina | |
| 5,441,102 A | 8/1995 | Burward-Hoy | |
| 5,453,641 A | 9/1995 | Mundinger et al. | |
| 5,592,363 A | 1/1997 | Atarashi et al. | |
| 5,727,618 A | 3/1998 | Mundinger et al. | |
| 5,823,249 A | 10/1998 | Batchelder | |
| 5,835,347 A * | 11/1998 | Chu ..................... | H01L 23/467 361/697 |
| 5,841,634 A | 11/1998 | Visser | |
| 5,864,464 A * | 1/1999 | Lin ..................... | H01L 23/467 361/697 |
| 5,998,240 A | 12/1999 | Hamilton et al. | |
| 6,019,165 A | 2/2000 | Batchelder | |
| 6,415,853 B1 | 7/2002 | Tao et al. | |
| 6,415,860 B1 | 7/2002 | Kelly et al. | |
| 6,447,270 B1 | 9/2002 | Schmidt et al. | |
| 6,679,315 B2 | 1/2004 | Cosley et al. | |
| 6,702,002 B2 | 3/2004 | Wang | |
| 6,748,755 B2 | 6/2004 | Kubo et al. | |
| 6,827,128 B2 | 12/2004 | Philpott et al. | |
| 6,952,345 B2 | 10/2005 | Weber et al. | |
| 6,986,382 B2 | 1/2006 | Upadhya et al. | |
| 6,988,534 B2 | 1/2006 | Kenny et al. | |
| 7,000,684 B2 | 2/2006 | Kenny et al. | |
| 7,007,506 B2 * | 3/2006 | Kubo ................. | H05K 7/20309 165/170 |
| 7,021,367 B2 | 4/2006 | Oikawa | |
| 7,029,647 B2 | 4/2006 | Tonkovich et al. | |
| 7,032,651 B2 | 4/2006 | Winslow et al. | |
| 7,104,312 B2 | 9/2006 | Goodson et al. | |
| 7,124,811 B2 | 10/2006 | Crocker et al. | |
| 7,131,486 B2 | 11/2006 | Goodson et al. | |
| 7,143,816 B1 | 12/2006 | Ghosh et al. | |
| 7,156,159 B2 | 1/2007 | Lovette et al. | |
| 7,190,580 B2 | 3/2007 | Bezama et al. | |
| 7,201,217 B2 | 4/2007 | Johnson et al. | |
| 7,206,203 B2 | 4/2007 | Campbell et al. | |
| 7,209,355 B2 | 4/2007 | Koga et al. | |
| 7,259,965 B2 | 8/2007 | Chang et al. | |
| 7,264,359 B2 | 9/2007 | Kawahara et al. | |
| 7,274,566 B2 | 9/2007 | Campbell et al. | |
| 7,301,771 B2 | 11/2007 | Hata et al. | |
| 7,331,378 B2 | 2/2008 | Bhatti et al. | |
| 7,360,582 B2 | 4/2008 | Olesen | |
| 7,466,553 B2 | 12/2008 | Hamman | |
| 7,527,085 B2 | 5/2009 | Iijima et al. | |
| 7,688,589 B2 | 3/2010 | Chiang | |
| 7,762,314 B2 | 7/2010 | Campbell et al. | |
| 7,806,168 B2 | 10/2010 | Upadhya et al. | |
| 7,971,632 B2 | 7/2011 | Eriksen et al. | |
| 8,051,898 B2 | 11/2011 | Chiang | |
| 8,066,057 B2 | 11/2011 | Olesen et al. | |
| 8,240,362 B2 | 8/2012 | Eriksen | |
| 8,245,764 B2 | 8/2012 | Eriksen | |
| 8,631,860 B2 | 1/2014 | Tang et al. | |
| 9,453,691 B2 | 9/2016 | Lyon | |
| 2002/0070007 A1 | 6/2002 | Calaman et al. | |
| 2002/0189790 A1 | 12/2002 | Wong | |
| 2003/0019234 A1 | 1/2003 | Wayburn et al. | |
| 2003/0070792 A1 | 4/2003 | Tanaka et al. | |
| 2003/0085028 A1 | 5/2003 | Galtz | |
| 2003/0151130 A1 | 8/2003 | Cheon | |
| 2003/0230400 A1 | 12/2003 | McCordic et al. | |
| 2004/0040695 A1 | 3/2004 | Chesser et al. | |
| 2004/0042171 A1 | 3/2004 | Takamatsu et al. | |
| 2004/0042172 A1 | 3/2004 | Kusaka et al. | |
| 2004/0104010 A1 | 6/2004 | Kenny et al. | |
| 2004/0104012 A1 | 6/2004 | Zhou et al. | |
| 2004/0104022 A1 | 6/2004 | Kenny et al. | |
| 2004/0112585 A1 | 6/2004 | Goodson et al. | |
| 2004/0123614 A1 | 7/2004 | Stewart | |
| 2004/0182548 A1 | 9/2004 | Lovette et al. | |
| 2004/0182560 A1 | 9/2004 | Kenny | |
| 2004/0188066 A1 | 9/2004 | Upadhya | |
| 2004/0206477 A1 | 10/2004 | Kenny et al. | |
| 2005/0069432 A1 | 3/2005 | Tomioka | |
| 2005/0178531 A1 | 8/2005 | Huang et al. | |
| 2005/0180104 A1 * | 8/2005 | Olesen ................ | H05K 7/20927 361/689 |
| 2005/0200001 A1 * | 9/2005 | Joshi ................... | F28F 3/08 257/714 |
| 2005/0205241 A1 | 9/2005 | Goodson et al. | |
| 2005/0210906 A1 * | 9/2005 | Laufer ................ | H01L 23/4735 257/E23.1 |
| 2005/0211417 A1 | 9/2005 | Upadhya | |
| 2005/0241809 A1 | 11/2005 | Tomioka et al. | |
| 2005/0269061 A1 | 12/2005 | Brewer et al. | |
| 2006/0002088 A1 | 1/2006 | Bezama | |
| 2006/0011329 A1 | 1/2006 | Wang et al. | |
| 2006/0096738 A1 | 5/2006 | Kang et al. | |
| 2006/0096740 A1 | 5/2006 | Zheng | |
| 2006/0096743 A1 | 5/2006 | Lee | |
| 2006/0137863 A1 | 6/2006 | Lee et al. | |
| 2006/0162903 A1 | 7/2006 | Bhatti et al. | |
| 2006/0171801 A1 | 8/2006 | Manabe et al. | |
| 2006/0185829 A1 | 8/2006 | Duan et al. | |
| 2006/0185830 A1 | 8/2006 | Duan | |
| 2006/0225867 A1 | 10/2006 | Park et al. | |
| 2006/0231238 A1 | 10/2006 | Ball | |
| 2006/0254755 A1 | 11/2006 | Chen et al. | |
| 2007/0029069 A1 | 2/2007 | Duan | |
| 2007/0034356 A1 | 2/2007 | Kenny et al. | |
| 2007/0039719 A1 | 2/2007 | Eriksen et al. | |
| 2007/0125526 A1 | 6/2007 | Satou et al. | |
| 2007/0131396 A1 | 6/2007 | Yu et al. | |
| 2007/0163750 A1 | 7/2007 | Bhatti et al. | |
| 2007/0193724 A1 | 8/2007 | Lin | |
| 2007/0227704 A1 | 10/2007 | Nagai et al. | |
| 2007/0272392 A1 * | 11/2007 | Ghosh ................. | H01L 23/4336 257/714 |
| 2008/0128114 A1 | 6/2008 | Ai et al. | |
| 2008/0179045 A1 | 7/2008 | Hu et al. | |
| 2008/0301941 A1 | 12/2008 | Anderson, Jr. et al. | |
| 2009/0071625 A1 | 3/2009 | Lyon | |
| 2009/0101315 A1 | 4/2009 | Cheng | |
| 2009/0139698 A1 | 6/2009 | Robinson | |

(56) References Cited

U.S. PATENT DOCUMENTS

| | | |
|---|---|---|
| 2010/0012294 A1 | 1/2010 | Bezama et al. |
| 2010/0326634 A1 | 12/2010 | Eriksen |
| 2012/0152498 A1 | 6/2012 | Lyon |
| 2012/0175094 A1 | 7/2012 | Rice |

FOREIGN PATENT DOCUMENTS

| | | | |
|---|---|---|---|
| JP | H03-17443 | | 1/1991 |
| JP | 06120387 | | 4/1994 |
| JP | 06120387 | A * | 4/1994 |
| JP | 2002151638 | | 5/2002 |
| JP | 2005123496 | | 5/2005 |
| JP | 2007180505 | | 7/2007 |
| JP | 2007227902 | | 9/2007 |
| JP | 2007531991 | | 11/2007 |
| TW | M273031 | | 8/2005 |
| TW | M298733 | | 8/2005 |
| WO | 0165900 | | 9/2001 |
| WO | 2004042306 | | 5/2004 |
| WO | 2005096377 | | 10/2005 |
| WO | WO-2005096377 A1 * | 10/2005 | ................ F28F 3/12 |
| WO | WO2006052317 A2 | | 5/2006 |
| WO | 2006119761 | | 11/2006 |

OTHER PUBLICATIONS

Osinski, United States Patent and Trademark Office Decision of Institution of Inter Partes Review. Filed Dec. 9, 2015 in Case IPR2015-01276.
Pollard, United States Patent and Trademark Office Patent Owner's Response. Filed Mar. 9, 2016 in Case IPR2015-01276.
Petition for Inter Parties Review of U.S. Pat. No. 8,746,330 in *Asetek Danmark A/S v. CoolIT Systems Inc.* filed May 27, 2015.
Declaration of Dr. Donald Tilton (including his CV) from Petition for Inter Parties Review of U.S. Pat. No. 8,746,330 in *Asetek Danmark A/S v. CoolIT Systems Inc.* dated May 27, 2015.
Roy W. Knight et al., "Heat Sink Optimization with Application to Microchannels," IEEE Transactions on Components, Hybrids, and Manufacturing Technology, vol. 15, No. 5, Oct. 1992, pp. 832-842.
Kandlikar, So,High Flux Heat Removal with Microchannels—A Roadmap of Challenges and Opportunities, Heat Transfer Engr'g. 26(8):5-14 (2005).
Steineke, M_and Kandlikar, So,Single-Phase Heat Transfer Enhancement Techniques in Microchannel and Minichannel Flows, Microchannels and Minichannels—Jun. 17-19, 2004, Rochester, New York, USA (2004).
Preissuance Submission Dated Jan. 9, 2015, in U.S. Appl. No. 13/401,618.
Examination Report dated Mar. 11, 2011, in European Patent Application No. 07075014.6; 3 pages total.
Technical Opinion dated Jan. 10, 2013, for Japanese Registration No. 3179086 (Utility Model Application No. 2012-002117); English translation included; 7 pages.
Chinese-language Search and Examination Reports dated Apr. 9, 2014, for Taiwan Patent Application No. 101110072 (English translation included); 40 pages total.
Office Action for U.S. Appl. No. 12/189,476 dated Apr. 13, 2012; 17 pages.
Final Office Action for U.S. Appl. No. 12/189,476 dated Jan. 7, 2013; 10 pages.
Rob Darby, " Internal Flow Applications," Chemical Engineering Fluid Mechanics, 2001, pp. 195-238, Chapter 7, Marcel Dekker, Inc., New York, NY.
John S. Scott, "Header" and "Manifold," Dictionary of Civil Engineering, 4th Edition, 1993, pp. 211 and 269, Van Nostrand Reinhold, New York, NY.
Petition for Inter Partes Review in *Asetek Danmark A/S v. CoolIT Systems, Inc.*, Mar. 26, 2020, Case IPR2020-00747.
Patent Owner's Preliminary Response in *Asetek Danmark A/S v. CoolIT Systems, Inc.*, Jul. 7, 2020, Case IPR2020-00747.
Petitioner's Reply to Patent Owner's Preliminary Response in *Asetek Danmark A/S v. CoolIT Systems, Inc.*, Jul. 24, 2020, Case IPR2020-00747.
Patent Owner's Sur-Reply in Support of Patent Owner's Preliminary Response in *Asetek Danmark A/S v. CoolIT Systems, Inc.*, Aug. 7, 2020, Case IPR2020-00747.
Institution Decision entered Oct. 2, 2020, Case IPR2020-00747.
Declaration of Donald E. Tilton, Ph.D. in *Asetek Danmark A/S v. CoolIT Systems, Inc.*, Mar. 25, 2020, Case IPR2020-00747.
Petition for Inter Partes Review in *Asetek Danmark A/S v. CoolIT Systems, Inc.*, Apr. 10, 2020, Case IPR2020-00825.
Patent Owner's Preliminary Response in *Asetek Danmark A/S v. CoolIT Systems, Inc.*, Jul. 14, 2020, Case IPR2020-00825.
Petitioner's Reply to Patent Owner's Preliminary Response in *Asetek Danmark A/S v. CoolIT Systems, Inc.*, Jul. 31, 2020, Case IPR2020-00825.
Patent Owner's Sur-Reply in Support of Patent Owner's Preliminary Response in *Asetek Danmark A/S v. CoolIT Systems, Inc.*, Jul. 31, 2020, Case IPR2020-00825.
Institution Decision entered Oct. 13, 2020, IPR2020-00825.
Declaration of Donald E. Tilton, Ph.D. in *Asetek Danmark A/S v. CoolIT Systems, Inc.*, Apr. 10, 2020, Case IPR2020-00825.
CPU-360 Water Block (AMD/Intel Processor). Rev 1.1, Koolance, (https://koolance.com/cpu-360-processor-water-block) last accessed on Oct. 30, 2020, 1 page.
"Asetek WaterChill Antarctica Water Cooling Kit," Asetek, (https://www.extremeoverclocking.com/reviews/cooling/WaterChill_Antarctica_1.html) last accessed on Oct. 30, 2020, 11 pages.
Hilbert Hagedoom, "Aseteck Waterchill Watercooling—p. 1—a Chill Introduction," Guru3D.com, Feb. 28, 2005, (https://www.guru3d.com/articles-pages/asetek-waterchill-watercooling) last accessed on Nov. 3, 2020, 25 pages.
Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.
Matthew Homan, "WaterChill By Asetek," TechwareLabs, LLC, Dec. 11, 2004, (http://www.techwarelabs.com/reviews/cooling/asetek_waterchill/) last accessed on Oct. 30, 2020 3 pages.
3DGAMEMAN, "#530—Asetek WaterChill2 Water Cooling Kit," YouTube, Jul. 16, 2006, (https://www.youtube.com/watch?v=60XNAXO9cxY) last accessed on Oct. 30, 2020.
3DGAMEMAN, "#596—Asetek Xtreme WaterChill Water Cooling Kit," YouTube, Jul. 17, 2006, (https://www.youtube.com/watch?v=Z9XSJBCJttU) last accessed on Oct. 29, 2020.
Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.
Super1080p, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica For Intel Socket 478, AMD Docket A/754/940," Apr. 13, 2004, 14 pages, Version 4.0, Asetek, Inc.
"WaterChill CPU Cooler Antarctica For Intel Socket 478, AMD Docket 462/754/940," Jun. 4, 2004, 9 pages, Version 4.1, Asetek, Inc.
"WaterChill CPU Cooler Antarctica For Intel Socket 478, AMD Docket A/754/940," Mar. 30, 2004, 2 pages, Version 4.0, Asetek, Inc.
"WaterChill CPU Cooler Antarctica Pour Port Intel Socket 478, AMD Docket 462/754/940," Jun. 4, 2004, 10 pages, Version 4.0, Asetek, Inc.
"WaterChill CPU-Kühler Antarctica Für Intel Socket 478, AMD Docket 462/754/940," Jun. 4, 2004, 10 pages, Version 4.0, Asetek, Inc.
Refrigerador de CPUs WaterChill Antarctica Para Intel Socket 478, AMD Socket 462/754/940, Jun. 4, 2004, 9, pages, Version 4.0, Asetek, Inc.
"WaterChill CPU-Kühler Antarctica Für Intel Socket 478, AMD Docket 462/754/939/940," Jun. 4, 2004, & Oct. 18, 2004, 9 pages, Version 4.0 & 4.1, Asetek, Inc.

(56) References Cited

OTHER PUBLICATIONS

"WaterChill CPU Cooler Antarctica For Intel Socket 478, AMD Socket 462/754/939/940," Jun. 4, 2004 & Oct. 18, 2004, 9 pages, Version 4.0 & 4.1, Asetek, Inc.

"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.

"WaterChill CPU Cooler Antarctica Pour Port Intel Socket 478, AMD Docket 462/754/939/940," Jun. 4, 2004 & Oct. 18, 2004, 10 pages, Version 4.0 & 4.1, Asetek, Inc.

Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.

Notice of Allowance in U.S. Appl. No. 15/912,478, mailed Mar. 6, 2019, 11 pages.

Claim Construction Order, Docket 149, *Asetek Denmark A/S v. CoolIT Systems, Inc.*, 3:19-cv-00410-EMC (N.D. Cal., Jul. 22, 2020).

Claim Construction Order, Docket 258, *Asetek Denmark A/S v. CoolIT Systems, Inc.*, 3:19-cv-00410-EMC (N.D. Cal., Jul. 8, 2021).

Final Written Decision, Paper 50, *Asetek Denmark A/S v. CoolIT Systems, Inc.*, IPR2020-00825 (P.T.A.B., Oct. 12, 2021) (on appeal to CAFC, stipulated motion to withdraw appeal pending).

Declaration of Marc Hodes, Ph.D., Exhibit 2001, *Asetek Denmark A/S v. CoolIT Systems, Inc.*, IPR2020-00825 (P.T.A. B., Oct. 12, 2021) (on appeal to CAFC, stipulated motion to withdraw appeal pending).

Corrected Declaration of Himanshu Pokharna, Ph.D., Exhibit 2038, *Asetek Denmark A/S v. CoolIT Systems, Inc.*, IPR2020-00825 (P.T.A.B., Oct. 12, 2021) (on appeal to CAFC, stipulated motion to withdraw appeal pending).

https://www.researchgate.net/publication/3521254, titled "Microchannel heat exchanger optimization", George Harpole, Mar. 1991.

U.S. Appl. No. 17/079,225, Non-Final Office Action, mailed Nov. 28, 2023.

\* cited by examiner

FLUID HEAT EXCHANGER

CROSS REFERENCE TO RELATED APPLICATIONS

This application claims the benefit of and priority to co-pending U.S. patent application Ser. No. 14/283,163, filed on May 20, 2014, set to issue as U.S. Pat. No. 9,603,284, which claims the benefit of and priority to U.S. patent application Ser. No. 12/189,476, filed on Aug. 11, 2008, now U.S. Pat. No. 8,746,330, which claims benefit of and priority to U.S. Provisional Patent Application No. 60/954,987, filed on Aug. 9, 2007, each of which patent applications is hereby incorporated by reference in its respective entirety, for all purposes.

FIELD

The present invention is directed to a fluid heat exchanger and, in particular, a fluid heat exchanger for an electronics application such as in a computer system.

BACKGROUND

Fluid heat exchangers are used to cool electronic devices by accepting and dissipating thermal energy therefrom.

Fluid heat exchangers seek to dissipate to a fluid passing therethrough, thermal energy communicated to them from a heat source.

SUMMARY

In accordance with a broad aspect of the invention, there is provided a fluid heat exchanger comprising: a heat spreader plate including an intended heat generating component contact region; a plurality of microchannels for directing heat transfer fluid over the heat spreader plate, the plurality of microchannels each having a first end and an opposite end and each of the plurality of microchannels extending substantially parallel with each other microchannel and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening.

In accordance with another broad aspect of the present invention, there is provided a method for cooling a heat generating component comprising: providing a fluid heat exchanger including a heat spreader plate; a plurality of microchannels for directing heat transfer fluid over the heat spreader plate, the plurality of microchannels each having a first end and an opposite end and each of the plurality of microchannels having a continuous channel flow path between their first ends and their opposite ends; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends; mounting the heat spreader plate onto the heat generating component creating a heat generating component contact region where the heat generating component contacts the heat spreader plate; introducing a flow of heat exchanging fluid to the fluid heat exchanger; urging the flow of heat exchanging fluid through the fluid inlet into the plurality of microchannels first to a microchannel region between the ends of the microchannel; and, diverting the flow of heat exchanging fluid into a plurality of subflows that each flow away from the other, a first of the plurality of subflows flowing from the fluid inlet toward the first fluid outlet and a second of the plurality of subflows flowing from the fluid inlet toward the opposite fluid outlet.

It is to be understood that other aspects of the present invention will become readily apparent to those skilled in the art from the following detailed description, wherein various embodiments of the invention are shown and described by way of illustration. As will be realized, the invention is capable for other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Referring to the drawings wherein like reference numerals indicate similar parts throughout the several views, several aspects of the present invention are illustrated by way of example, and not by way of limitation, in detail in the figures, wherein.

DESCRIPTION OF VARIOUS EMBODIMENTS

The detailed description set forth below in connection with the appended drawings is intended as a description of various embodiments of the present invention and is not intended to represent the only embodiments contemplated by the inventor. The detailed description includes specific details for the purpose of providing a comprehensive understanding of the present invention. However, it will be apparent to those skilled in the art that the present invention may be practiced without these specific details.

Figure 1:
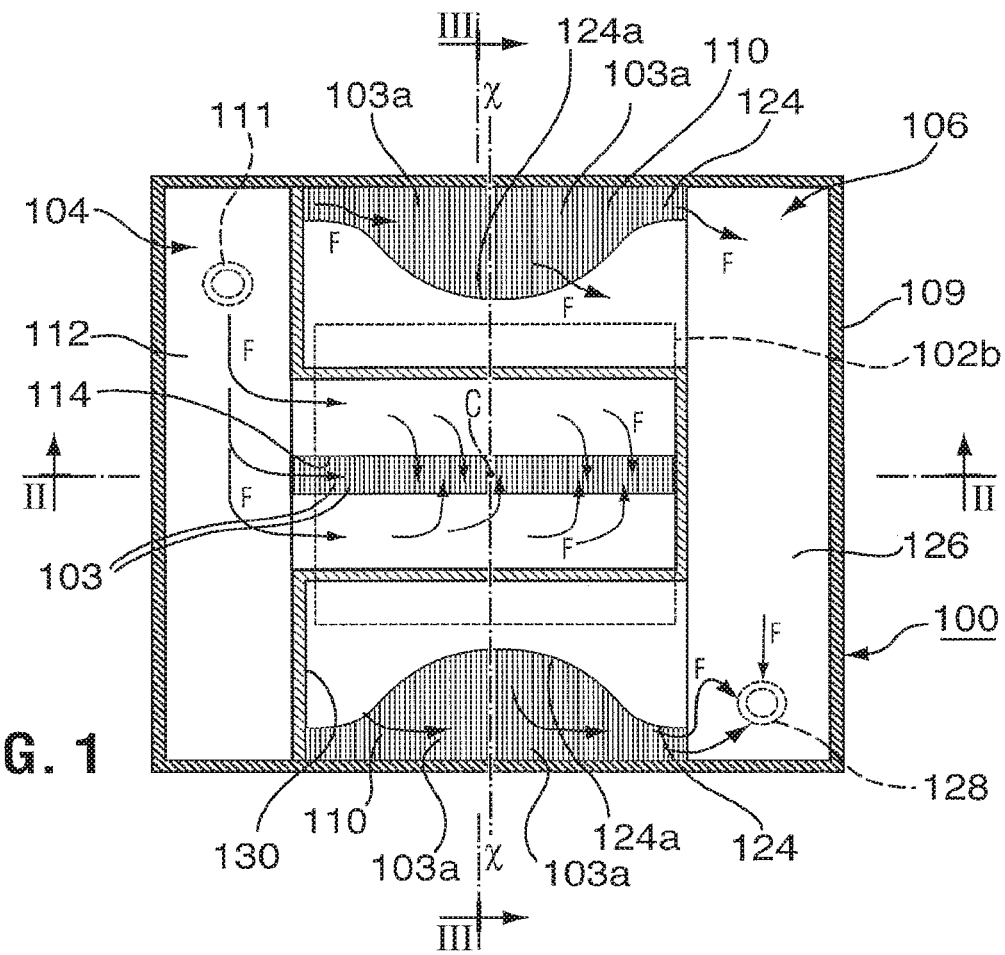
FIG. 1 is a top plan view of a fluid heat exchanger according to one embodiment of the invention, with the top cap cut away to facilitate viewing internal components.
Figure 2:
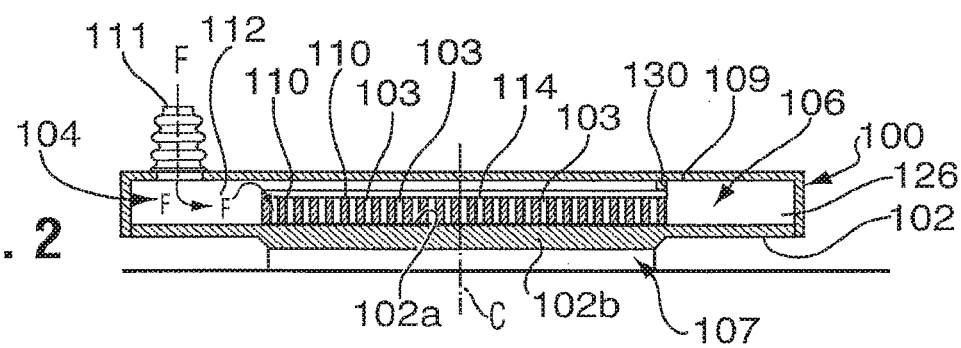
FIG. 2 is a sectional view along line II-II of FIG. 1.
Figure 3:
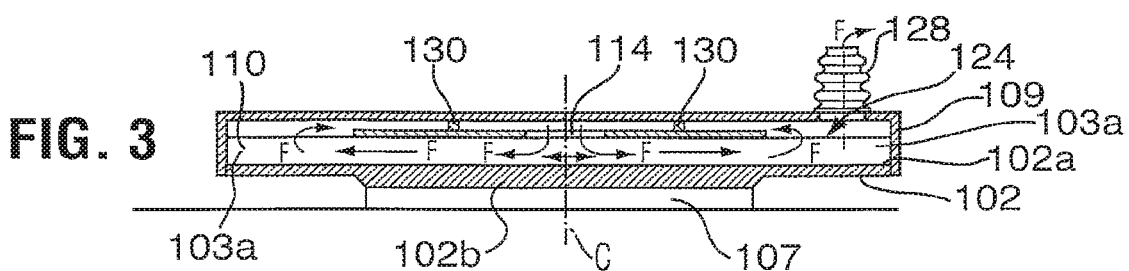
FIG. 3 is a sectional view along line III-III of FIG. 1.

With reference to FIGS. 1 to 3, a fluid heat exchanger 100 is shown. Fluid heat exchanger 100 includes a heat spreader plate 102, an arrangement of fluid microchannels 103 defined between walls 110, a fluid inlet passage 104, and a fluid outlet passage 106. A housing 109 operates with heat spreader plate 102 to form an outer limit of the heat sink and to define fluid flow passages 104, 106.

As shown in FIGS. 2 and 3, in use the heat exchanger 100 is coupled to a heat source 107, such as an electronic device, including, but not limited to a microchip or an integrated circuit. The heat exchanger may be thermally coupled to the heat source by a thermal interface material disposed therebetween, by coupling directly to the surface of the heat source, or by integrally forming the heat source and at least the heat spreader plate 102 of the fluid heat exchanger. The heat exchanger 100 may take various forms and shapes, but heat spreader plate 102 is formed to accept thermal energy from heat source 107. Heat spreader plate 102 includes an intended heat generating component contact region 102b positioned in a known location thereon. In the illustrated embodiment, heat spreader plate 102 includes a protrusion at region 102b that controls the positioning of the heat spreader plate relative to the heat source, but such a protrusion need not be included. Heat spreader plate 102 may include a portion of more conductive material to facilitate and control heat transfer, if desired. In any event, heat spreader plate is formed to fit over and thermally communicate with a heat source in a region 102b, usually located centrally relative to the edges of the heat spreader plate.

Microchannels 103 are formed to accept and allow passage therethrough of the flow of heat exchanging fluid such that the fluid can move along heat spreader plate 102 and walls 110 and accept and dissipate heat energy from them. In the illustrated embodiment, microchannels 103 are defined by walls 110 that are thermally coupled to the heat spreader plate to accept thermal energy therefrom. For example, heat spreader plate 102 may include an inner facing, upper surface 102a and a plurality of microchannel walls 110 may extend upwardly therefrom, whereby the channel area, defined between upper surface 102a and the microchannel walls 110, channels or directs fluid to create a fluid flow path. The channel area may be open or filled with thermally conductive porous material such as metal or silicon foam, sintered metal, etc. Thermally conductive, porous materials allow flow through the channels but create a tortuous flow path.

Surface 102a and microchannel walls 110 allow the fluid to undergo exchange of thermal energy from the heat spreader plate to cool the heat source coupled to the heat spreader plate. The upper surface 102a and walls 110 have a high thermal conductivity to allow heat transfer from the heat source 107 to fluid passing through channels 103. The surfaces forming channels 103 may be smooth and solid, formed with a porous structure, such as of sintered metal and/or metal or silicon foam or roughened, for example, including troughs and/or crests designed to collect or repel fluid from a particular location or to create selected fluid flow properties. Facing microchannel walls 110 may be configured in a parallel configuration, as shown, or may be formed otherwise, provided fluid can flow between the microchannel walls 110 along a fluid path. It will be apparent to one skilled in the art that the microchannel walls 110 may be alternatively configured in any other appropriate configuration depending on various factors of desired flow, thermal exchange, etc. For instance, grooves may be formed between sections of microchannel walls 110. Generally, microchannel walls 110 may desirably have dimensions and properties which seek to reduce or possibly minimize the pressure drop or differential of fluid flowing through the channels 103 defined therebetween.

The microchannel walls 110 may have a width dimension within the range of 20 microns to 1 millimeter and a height dimension within the range of 100 microns to five millimeters, depending on the power of the heat source 107, desired cooling effect, etc. The microchannel walls 110 may have a length dimension which ranges between 100 microns and several centimeters, depending on the dimensions of, and the heat flux density from, the heat source. In one embodiment, the walls 110 extend the full length (which may be a width) dimension of the heat spreader plate passing fully through region 102b. These are exemplary dimensions and, of course, other microchannel wall dimensions are possible. The microchannel walls 110 may be spaced apart by a separation dimension range of 20 microns to 1 millimeter, depending on the power of the heat source 107, although other separation dimensions are contemplated.

Other microporous channel configurations may be used alternatively to, or together with, microchannels, such as for example, a series of pillars, fins, or undulations, etc. which extend upwards from the heat spreader plate upper surface or tortuous channels as formed by a foam or sintered surface.

Fluid heat exchanger 100 further includes a fluid inlet passage 104, which in the illustrated embodiment includes a port 111 through the housing opening to a header 112 and thereafter a fluid inlet opening 114 to the microporous fluid channels 103.

The port and the header can be formed in various ways and configurations. For example, port 111 may be positioned on top, as shown, side or end regions of the heat exchanger, as desired. Port 111 and header 112 are generally of a larger cross sectional area than opening 114, so that a mass flow of fluid can be communicated substantially without restriction to opening 114.

Although only a single fluid inlet opening 114 is shown, there may be one or more fluid inlet openings providing communication from the header to the fluid microchannels 103.

Fluid inlet opening 114 may open to microchannels 103 opposite the heat spreader plate such that fluid passing through the opening may pass between walls 110 toward surface 102a, before being diverted along the axial length of the channels, which extend parallel to axis x. Since most installations will position the heat spreader plate as the lowermost, as determined by gravity, component of heat exchanger 100, the fluid inlet openings 114 can generally be described as being positioned above the microchannels 103 such that fluid may flow through opening 114 down into the channels in a direction orthogonal relative to the plane of surface 102a and towards surface 102a and then change direction to pass along the lengths of channels 103 substantially parallel to surface 102a and axis x. Such direction change is driven by impingement of fluid against surface 102a.

Fluid inlet opening 114 may be positioned adjacent to the known intended heat generating component contact region 102b since this region of the heat spreader plate may be exposed to greater inputs of thermal energy than other regions on plate 102. Positioning the fluid inlet opening adjacent region 102b seeks to introduce fresh heat exchanging fluid first and directly to the hottest region of the heat exchanger. The position, arrangement and/or dimensions of opening 114 may be determined with consideration of the position of region 102b such that opening 114 may be placed adjacent, for example orthogonally opposite to, or according to the usual mounting configuration above, the intended heat generating component contact region 102b on the heat plate. The delivery of fresh fluid first to the region that is in direct communication with the heat generating component to be cooled seeks to create a uniform temperature at the contact region as well as areas in the heat spreader plate away from the contact region.

In the illustrated embodiment, opening 114 is positioned to have its geometric center aligned over the center, for example the geometric center, of region 102b. It is noted that it may facilitate construction and installation by intending, and possibly forming, the heat sink spreader plate to be installed with the heat generating component positioned on the plate substantially centrally, with respect to the plate's perimeter edges, and then opening 114 may be positioned also with its geometric center substantially centrally with respect to the perimeter edges of the heat spreader plate. In this way, the geometric center points of each of opening 114, the heat spreader plate and the heat generating component may all be substantially aligned, as at C.

Opening 114 may extend over any channel 103 through which it is desired that heat exchange fluid flows. Openings 114 may take various forms including, for example, various shapes, various widths, straight or curved edges (in plane or in section) to provide fluid flow features, open area, etc., as desired.

Heat exchanger 100 further includes a fluid outlet passage 106, which in the illustrated embodiment includes one or more fluid outlet openings 124 from the microporous fluid channels 103, a header 126 and an outlet port 128 opening from the housing. Although two fluid outlet openings 124 are shown, there may be one or more fluid outlet openings providing communication to the header from the fluid channels 103.

The port and the header can be formed in various ways and configurations. For example, port 128 may be positioned on top, as shown, side or end regions of the heat exchanger, as desired.

Fluid outlet openings 124 may be positioned at the end of microchannels 103. Alternately or in addition, as shown, fluid outlet openings 124 may create an opening opposite heat spreader plate 102 such that fluid passing through the channels pass axially along the length of the channels between walls 110 and then changes direction to pass away from surface 102a out from between the walls 110 to exit through openings 124. Since most installations will position the heat spreader plate as the lowermost, as determined by gravity, component of heat exchanger 100, the fluid outlet openings 124 will generally be positioned above the microchannels 103 such that fluid may flow from the channels upwardly through openings 124.

Fluid outlet openings 124 may be spaced from fluid inlet openings 114 so that fluid is forced to pass through at least a portion of the length of channels 103 where heat exchange occurs before exiting the microchannels. Generally, fluid outlet openings 124 may be spaced from the known intended heat generating component contact region 102b.

In the illustrated embodiment, where heat exchanger 100 is intended to be mounted with heat source 107 generally centrally positioned relative to the perimeter edges of heat spreader plate 102, and thereby the ends 103a of channels, openings 124 may be positioned at or adjacent channel ends 103a.

At least one opening 124 extends over any channel 103 through which it is desired that heat exchange fluid flows. Openings 124 may take various forms including, for example, various shapes, various widths, straight or curved edges (in plane or in section) to provide fluid flow features, open area, etc. as desired.

Fluid inlet opening 114 may open away from the ends of the microchannels, for example along a length of a microchannel between its ends. In this way, fluid is introduced to a middle region of a continuous channel 103 rather than fluid being introduced to one end of a channel and allowing it to flow the entire length of the channel. In the illustrated embodiment, heat exchanger 100 is intended to be mounted with heat source 107 generally centrally positioned relative to the perimeter edges of heat spreader plate 102. As such, in the illustrated embodiment, opening 114 is positioned generally centrally relative to the edges of the heat plate 102. Since the channels, in the illustrated embodiment extend substantially continuously along the length of the heat plate between opposing side perimeter edges thereof, opening 114 opens generally centrally between ends 103a of each channel. For example, opening 114 may be positioned in the middle 50% of the heat exchanger or possibly the middle 20% of the heat exchanger. The delivery of fresh fluid to the central region where the heat generating component is in direct communication with the heat spreader plate, first before passing through the remaining lengths of channels seeks to create a uniform temperature at region 102b as well as areas in the heat spreader plate adjacent to the intended mounting position. The introduction of fluid to a region along a middle region of the microchannels after which the flow splits into two sub flows to pass outwardly from the inlet towards a pair of outlets, each of which is positioned at the ends of the channels reduces the pressure drop of fluid passing along the channels over that pressure drop that would be created if the fluid passed along the entire length of each channel. Splitting the fluid flow to allow only approximately one half of the mass inlet flow to pass along any particular region of the microchannels creates less back pressure and less flow resistance, allows faster fluid flow through the channels and lessens the pump force required to move the fluid through the heat exchanger.

In use, heat spreader plate 102 is positioned in thermal communication with heat source 107 at region 102b. Heat generated by heat source 107 is conducted up through heat spreader plate 102 to surface 102a and walls 110. Heat exchanging fluid, as shown by arrows F, enters the fluid heat exchanger through port 111, passes into the header 112 and through opening 114. The heat exchanging fluid then passes down between walls 110 into channels 103, where the fluid accepts thermal energy from the walls 110 and surface 102a. The heat exchanging fluid, after passing down into the channels, then impinges against surface 102a to be diverted toward ends 103a of the channels toward outlet openings 124. In so doing, in the illustrated embodiment, the fluid is generally split into two subflows moving away from each other and away from inlet 114 toward openings 124 at the ends of the microchannels. Fluid passing through channels becomes heated, especially when passing over the region in direct contact with the heat source, such as, in the illustrated embodiment, the central region of the heat spreader plate. Heated fluid passes out of openings 124, into header and thereafter through port 128. The heated fluid will circulate through a heat sink where its thermal energy is unloaded before circulating back to port 111.

The individual and relative positioning and sizing of openings 114 and 124 may allow fluid to circulate through the heat exchanging channels 103 while reducing the pressure drop generated in fluid passing through heat exchanger 100, when compared to other positionings and sizings. In the illustrated embodiment, for example, the central region 124a of outlet openings 124 are scalloped to offer an enlarged outlet region from the centrally located channels, relative to those on the edges. This shaping provides that the outlet openings from some centrally positioned channels 103, relative to the sides of the heat exchanger, are larger than the outlet openings from other channels closer to the edges. This provides that fluid flowing through the more centrally located channels encounters less resistance to flow therethrough, again facilitating flow past the central mounting region 102b on heat spreader plate 102.

A seal 130 separates fluid inlet passage 104 from fluid outlet passage 106 so that fluid must pass through the microporous channels 103 past heat spreader plate surface 102a.

Figure 5:
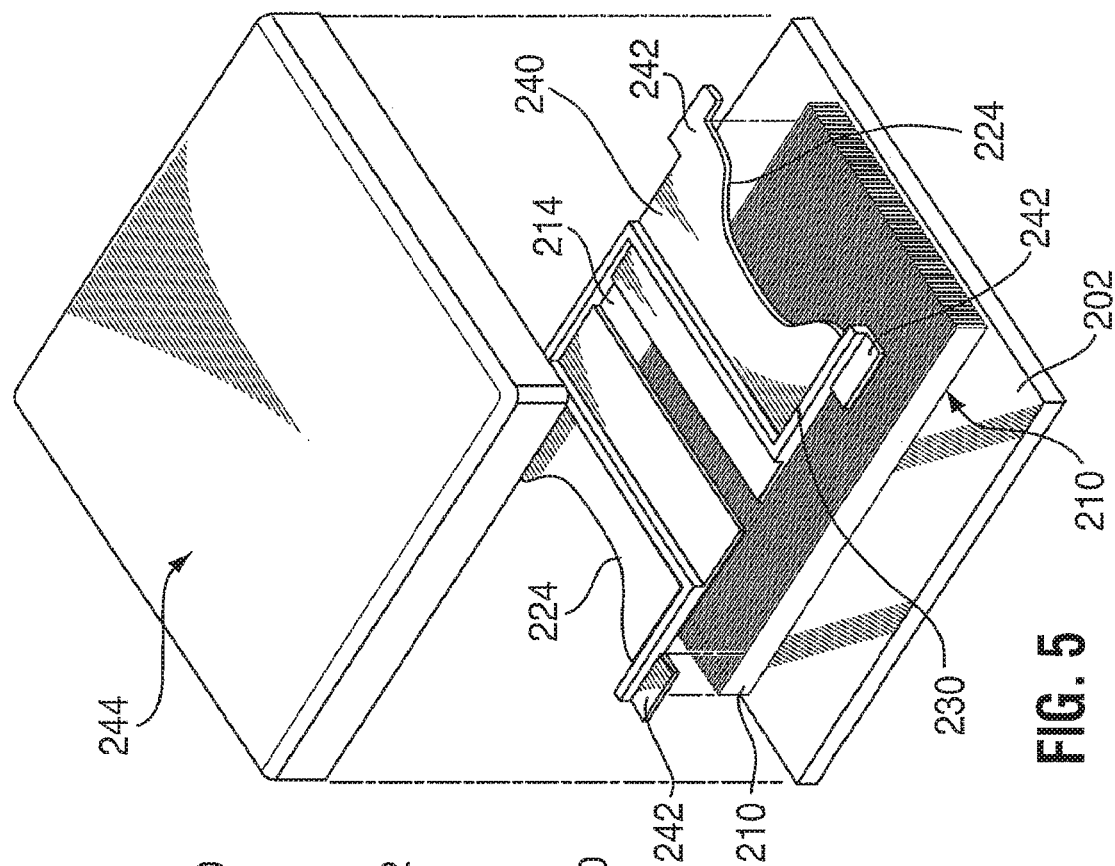
FIG. 5 is a top plan view of the fluid heat exchanger of FIG. 4 assembled with its top cap removed.
Figure 4:
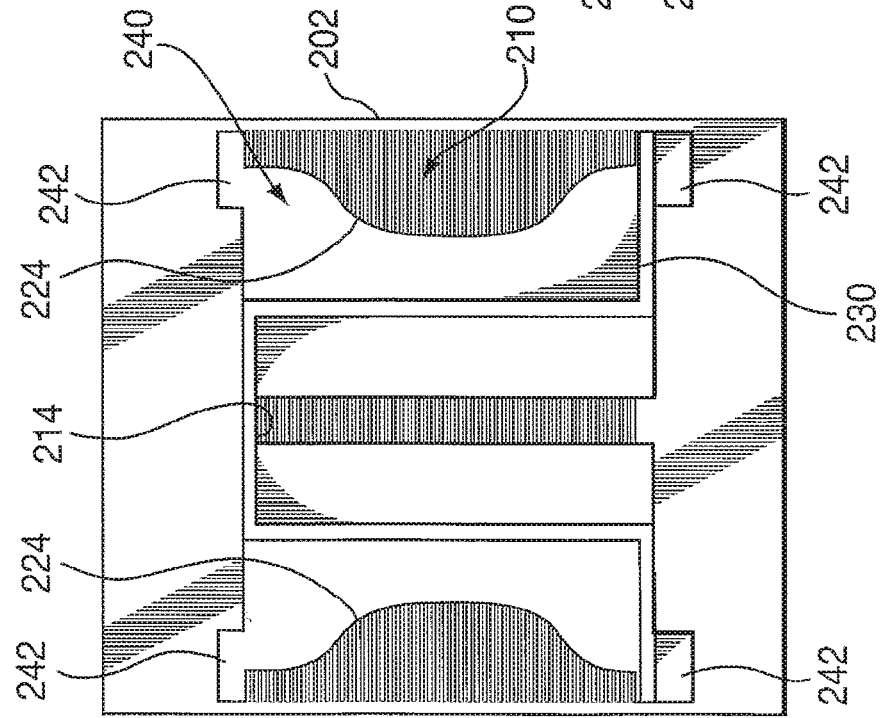
FIG. 4 is an exploded, perspective view of a fluid heat exchanger according to another embodiment of the invention.

With reference to FIGS. 4 and 5, a useful method for manufacturing a fluid heat exchanger is described. A heat spreader plate 202 may be provided which has heat conductive properties through its thickness at least about a central region thereof.

Microchannels may be formed on the surface of the heat spreader plate, as by adding walls or forming walls by building up or removing materials from the surface of the heat plate. In one embodiment, skiving is used to form walls 210.

A plate 240 may be installed over the walls 210 to close off the channels across the upper limits of walls 210. Plate 240 has portions removed to create inlet and outlet openings 214 and 224, respectively, in the final heat exchanger. Tabs 242 may be used to assist with the positioning and installation of plate 240, wherein tabs 242 are bent down over the two outermost walls.

Seal 230 may be installed as a portion of plate 240 or separately.

After plate 240 and seal 230 are positioned, a top cap 244 can be installed over the assembly. Top cap 244 can include side walls that extend down to a position adjacent heat spreader plate.

The parts may be connected during assembly thereof or afterward by overall fusing techniques. In so doing, the parts are connected so that short circuiting from inlet passage to outlet passage is substantially avoided, setting up the fluid circuit as described herein above wherein the fluid flows from opening 214 to openings 224 through the channels defined between walls 210.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are know or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

I claim:

1. A fluid heat exchanger for cooling an electronic device, the heat exchanger comprising:
    a heat spreader plate having a central region and a plurality of walls defining a corresponding plurality of microchannels;
    a second plate having an upper major surface and a lower major surface, the lower major surface positioned overtop the plurality of walls to close off the corresponding plurality of microchannels, the second plate defining a raised seal portion positioned opposite the plurality of walls relative to the second plate, the second plate further defining a first aperture and a pair of opposed edges that flank the first aperture, wherein the first aperture opens through the second plate opposite the central region of the heat spreader plate relative to the plurality of walls;
    a housing comprising a top cap, the top cap being positioned overtop the second plate, wherein the raised seal portion extends from the upper surface of the second plate to the top cap, wherein the housing has a first port and a second port;
    a first fluid passage configured convey a heat-exchange fluid through the first port and to fluidically couple the plurality of microchannels with the first port through the first aperture; and
    a second fluid passage configured to convey the heat-exchange fluid at a position laterally outward of the opposed edges of the second plate and to fluidically couple the plurality of microchannels with the second port.

2. The fluid heat exchanger according to claim 1, wherein the top cap comprises the inlet port, the outlet port, or both.

3. A fluid heat exchanger for cooling an electronic device, the heat exchanger comprising:
    a heat spreader plate having a plurality of walls that define a corresponding plurality of microchannels;
    a second plate positioned overtop the plurality of walls to close off the corresponding plurality of microchannels, the second plate defining an aperture and a seal;
    a first fluid passage having a first port and a first header, the first port and the first header fluidically coupled with the plurality of microchannels through the aperture of the second plate at a position opposite the heat spreader plate; and
    a second fluid passage having a second port and a second header, the first header and the second header fluidically coupled with the plurality of microchannels laterally outward of the aperture of the second plate, wherein the seal separates the first fluid passage from the second fluid passage, the second header having a first an intermediate region configured to convey a first portion of a flow of a coolant passing through the fluid heat exchanger, the second header further having a second intermediate region positioned opposite the first intermediate region and configured to convey a second portion of the flow of the coolant passing through the heat exchanger, wherein a portion of the first header positioned between the first intermediate region and the second intermediate region, and wherein the first header and the second header are further configured such that the first portion of the coolant and the second portion of the coolant are combined with each other at a position adjacent the first port and at a position adjacent the second port, respectively.

4. The fluid heat exchanger according to claim 3, further comprising a seal and a housing cover, wherein the seal extends from the second plate to the housing cover and separates the inlet passage from the outlet passage.

5. A fluid heat exchanger for cooling an electronic device, the heat exchanger comprising:
    a plurality of walls defining a corresponding plurality of microchannels, wherein each microchannel extends from a first end to a second end, and wherein the plurality of microchannels defines at least two opposed outer microchannels and a centrally located microchannel positioned between the opposed outer microchannels;

a fluid inlet passage comprising an inlet and being configured to deliver a heat-exchange fluid to each microchannel at a position between the corresponding first end and the corresponding second end of the respective microchannel; and a fluid outlet passage comprising an outlet port and an outlet region from both ends of each microchannel, wherein one or both outlet regions from the centrally located microchannel being enlarged compared to the corresponding one or both outlet regions from one or two of the opposed outer microchannels, the fluid heat exchanger further comprising a heat spreader plate, wherein each of the walls extends from a proximal edge adjoining the heat spreader plate to a distal edge spaced from the heat spreader plate, wherein the fluid outlet passage further comprises an intermediate chamber positioned between each respective outlet region and the outlet port.

6. The fluid heat exchanger according to claim 5, further comprising a manifold plate extending across the plurality of distal edges of the walls to close off each of the plurality of the microchannels across a region positioned opposite the heat spreader plate relative to the plurality of microchannels.

7. The fluid heat exchanger according to claim 6, further comprising a seal, wherein the seal is a portion of the manifold plate.

8. The fluid heat exchanger according to claim 6, wherein the fluid inlet passage comprises an inlet opening to the plurality of microchannels, and wherein the manifold plate defines the inlet opening.

9. A fluid heat exchanger for cooling an electronic device, the heat exchanger comprising:

a plurality of walls defining a corresponding plurality of microchannels, wherein each microchannel extends from a first end to a second end, and wherein the plurality of microchannels defines at least two opposed outer microchannels and a centrally located microchannel positioned between the opposed outer microchannels;

a fluid inlet passage configured to deliver a heat-exchange fluid to each microchannel at a position between the corresponding first end and the corresponding second end of the respective microchannel; and a fluid outlet passage having an outlet region from each microchannel, wherein the outlet region from the centrally located microchannel larger than a corresponding outlet region from one or two of the opposed outer microchannels, wherein the outlet region from the centrally located microchannel has a larger cross-sectional area compared to a cross-sectional area of the corresponding outlet region from one of the opposed outer microchannels, wherein the outlet passage further comprises an outlet header configured to receive the heat-exchange fluid from the first end and the second end of each microchannel.

10. A fluid heat exchanger for cooling an electronic device, the heat exchanger comprising:

a plurality of walls defining a corresponding plurality of microchannels, wherein each microchannel extends from a first end to a second end;

a plate so overlying the walls as to define boundary of each microchannel, the plate defining a raised seal and an aperture overlying the plurality of microchannels;

a fluid inlet passage comprising the aperture and being configured to deliver a heat-exchange fluid to each microchannel at a position between the first end and the second end of each respective microchannel among the plurality of microchannels; and a fluid outlet passage having an outlet opening from the first end and the second end of each respective microchannel, the fluid outlet passage further having an outlet port and an intermediate chamber configured to receive a flow of the heat-exhange fluid from the first end and the second end of each respective microchannel; and a housing overtop the plate and walls, wherein the raised seal extends from the plate to the housing, separating the inlet passage from the outlet passage.

11. The fluid heat exchanger according to claim 10, wherein the first outlet opening from each microchannel is positioned at the first end of the respective microchannel, wherein the second outlet opening of each microchannel is positioned at the second end of the respective microchannel.

12. A fluid heat exchanger for cooling an electronic device, the heat exchanger comprising:

a plurality of fins defining a corresponding plurality of microchannels;

a plate so overlying the fins as to define a boundary of each microchannel, the plate defining a raised seal and an aperture overlying the plurality of microchannels, the plate defining a pair of opposed edges flanking the aperture and overlying the plurality of microchannels;

a housing cover defining an underside surface positioned opposite the fins relative to the plate, wherein the underside surface is in contact with the raised seal defined by the plate;

a first fluid passage configured to convey a heat-exchange fluid through the aperture defined by the plate, wherein the plurality of microchannels convey the heat-exchange fluid therein and between the opposed edges of the plate and the aperture; and a second fluid passage configured to convey the heat-exchange fluid between each microchannel, wherein the fluid outlet passage has a first region positioned adjacent one of the pair of opposed edges of the plate and a second region positioned adjacent the other one of the pair of opposed edges of the plate, the second fluid outlet passage further comprising a header fluidically coupled with the first region and the second region of the second fluid passage..

13. The fluid heat exchanger according to claim 12, further comprising an outlet port configured to receive the heat-exchange fluid from the header.

14. The fluid heat exchanger according to claim 13, wherein the housing cover comprises the outlet port.

15. The fluid heat exchanger according to claim 14, wherein the inlet passage comprises an inlet port.

* * * * *